United States Patent
Tsinker et al.

(10) Patent No.: US 11,913,788 B2
(45) Date of Patent: Feb. 27, 2024

(54) ROUND ROBIN SENSOR DEVICE FOR PROCESSING SENSOR DATA

(71) Applicant: INVENSENSE, INC., San Jose, CA (US)

(72) Inventors: Vadim Tsinker, Belmont, CA (US); Frederico Mazzarella, Binasco (IT); Ali Shirvani, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 17/680,637

(22) Filed: Feb. 25, 2022

(65) Prior Publication Data

US 2023/0273025 A1    Aug. 31, 2023

(51) Int. Cl.

| | |
|---|---|
| *G01C 19/5776* | (2012.01) |
| *H03M 1/12* | (2006.01) |
| *G01P 15/08* | (2006.01) |
| *H03M 1/38* | (2006.01) |
| *G01C 19/5712* | (2012.01) |
| *G01P 15/125* | (2006.01) |

(52) U.S. Cl.
CPC .......... *G01C 19/5776* (2013.01); *G01P 15/08* (2013.01); *H03M 1/1245* (2013.01); *H03M 1/38* (2013.01); *G01C 19/5712* (2013.01); *G01P 15/125* (2013.01)

(58) Field of Classification Search
CPC .. G01C 19/5776; G01P 15/08; H03M 1/1245; H03M 1/38; H03M 1/124; H03M 1/14; H03M 1/123; H03M 1/50; H03M 1/52; H03M 1/34
See application file for complete search history.

(56) References Cited

U.S. PATENT DOCUMENTS

| | | | | |
|---|---|---|---|---|
| 5,400,025 A | * | 3/1995 | Pfeiffer | H03M 1/089 341/166 |
| 9,329,042 B1 | * | 5/2016 | Cazzaniga | G01C 19/5776 |
| 9,459,274 B2 | | 10/2016 | Shaeffer et al. | |
| 10,103,742 B1 | | 10/2018 | Guo et al. | |

(Continued)

OTHER PUBLICATIONS

Notice of Allowance received for U.S. Appl. No. 17/345,778 dated Dec. 6, 2023, 39 pages.

*Primary Examiner* — Helen C Kwok
(74) *Attorney, Agent, or Firm* — Amin, Turocy & Watson, LLP

(57) ABSTRACT

A round robin sensor device for processing sensor data is provided herein. The sensor device includes a multiplexer stage configured to sequentially select sensor outputs from one or more sensors continuously. Continuously and sequentially selecting sensor outputs results in a stream of selected sensor outputs. The sensor device also includes a charge-to-voltage converter operatively coupled to the multiplexer stage and configured to convert a charge from a first sensor of the one or more sensors to a voltage. Further, the sensor device includes a resettable integrator operatively coupled to the charge-to-voltage converter and configured to demodulate and integrate the voltage, resulting in an integrated voltage. Also included in the sensor device is an analog-to-digital converter operatively coupled to the resettable integrator and configured to digitize the integrated voltage to a digital code.

17 Claims, 5 Drawing Sheets

(56) References Cited

U.S. PATENT DOCUMENTS

| | | | |
|---|---|---|---|
| 2010/0132463 A1* | 6/2010 | Caminada | G01C 19/5712 |
| | | | 73/504.12 |
| 2014/0260619 A1* | 9/2014 | Shaeffer | G01P 1/04 |
| | | | 73/528 |
| 2019/0190535 A1* | 6/2019 | Tsinker | H03M 1/124 |
| 2022/0333957 A1* | 10/2022 | Mazzarella | H04Q 9/00 |
| 2023/0032538 A1* | 2/2023 | Pinna | H04B 1/0057 |

* cited by examiner

ROUND ROBIN SENSOR DEVICE FOR PROCESSING SENSOR DATA

TECHNICAL FIELD

This disclosure relates generally to the field of sensors, and more specifically, to processing of sensor data.

BACKGROUND

Multi-channel sensing involves processing outputs of sensors that have multiple simultaneous outputs. Alternatively, or additionally, multi-channel sensing involves processing outputs of multiple different sensors that operate simultaneously. For example, Micro Electromechanical System (MEMS) sensors, which are used in many electronic devices, can simultaneously detect motion in several different directions or axes (e.g., motion along an x axis, a y axis, and/or a z axis). An example MEMS sensor can include a suspended mass between pairs of capacitive plates. Each pair of capacitive plates is part of a respective sensing channel associated with a respective axis. When tilt or acceleration is applied to the MEMS sensor, the movement in suspended mass creates capacitance change.

Accordingly, unique challenges exist associated with sensor devices that perform multi-channel sensing.

SUMMARY

The subject application relates to a round robin sensor device for processing sensor data. Round robin sensing can facilitate sensing of sensor output continuously. The round robin sensor device can include a charge-to-voltage converter, a resettable integrator, and an analog to digital convertor. In some embodiments, the round robin sensor device includes a resettable charge-to-voltage converter, a resettable integrator, and an analog to digital convertor.

As will be described in further detail below, provided is a round robin sensor device for processing sensor data and related methods. The use of a resettable integrator, as discussed herein, reduces noise aliasing and eliminates unwanted harmonics. Further, the use of the resettable integrator provides increased signal gain due to elimination of unwanted harmonics in front of an analog to digital converter to mitigate and/or reduce analog to digital converter input referred noise.

Provided herein is a sensor device that includes a multiplexer stage configured to sequentially select sensor outputs from one or more sensors continuously. Continuously and sequentially selecting sensor outputs results in a stream of selected sensor outputs. The sensor device also includes a charge-to-voltage converter operatively coupled to the multiplexer stage and configured to convert a charge from a first sensor of the one or more sensors to a voltage. Further, the sensor device includes a resettable integrator operatively coupled to the charge-to-voltage converter and configured to demodulate and integrate the voltage, resulting in an integrated voltage. Also included in the sensor device is an analog-to-digital converter operatively coupled to the resettable integrator and configured to digitize the integrated voltage to a digital code.

In an example, the multiplexer stage selects axis, and C2V and the integrator are reset. The C2V converts charge to voltage which is integrated during C2V conversion period. At the end of integration the output is sampled by ADC. The ADC digitizes the sampled voltage while the C2V and Integrator return to step "1" for next axis. According to an implementation, the multiplexer stage comprises a multiplexer that sequentially selects the sensor outputs repetitively. Further to these implementations, the multiplexer sequentially selects the sensor outputs according to a round-robin selection sequence.

Sensors of the one or more sensors can represent one or more axes. The axes can include, but are not limited to an x axis, a y axis, and a z axis. Further, the multiplexer stage is configured to select an axis of the one or more axes in a sequential and continuous sequence.

According to an example, the analog-to-digital converter is a Nyquist analog to digital converter.

The one or more sensors can include a micro electromechanical system (MEMS) sensor. In an example, the sensor device is an accelerometer. In another example, the sensor device is a gyroscope. In yet another example, the sensor device is an optical pixel sensing circuit.

Also provided herein is a method for processing sensor data. The method includes selecting sensor outputs in a repetitive sequence, resulting in a stream of selected sensor outputs. The method also includes converting charge from the sensor outputs into a voltage. Further, the method includes converting the voltage into a stream of digitized outputs and switching to a next sensor. Converting the voltage and switching to the next sensor are performed at a same time or at substantially a same time.

In an example, converting the voltage into the stream of digitized outputs includes converting the voltage via an analog to digital converter. According to an implementation, the method includes, prior to converting the voltage into the stream of digitized outputs, demodulating and integrating the voltage. The result of the demodulating and integrating the voltage is an integrated voltage. The integrated voltage is converted into the stream of digitized outputs.

In some implementations, the method includes determining that sampling by an analog to digital converter is completed. Further to these implementations, the method includes resetting a charge-to-voltage converter and a resettable integrator based on the determination that the sampling is complete.

In accordance with some implementations, the method includes digitizing a sampled value for a previous axis (e.g., previous to a current axis being digitized and sampled). The method also includes resetting a charge-to-voltage converter and a resettable integrator at substantially the same time as the digitizing. Further, the method includes integrating a next axis (e.g., an axis subsequent or sequentially after the current axis) analog input after the resetting.

In an example, the repetitive sequence is a round-robin selection sequence. In another example, switching to the next sensor comprises sequentially selecting the sensor outputs repetitively. For example, the sensor outputs can be selected in a round robin manner.

In some implementations, the sensor outputs comprise outputs from a micro electro-mechanical system (MEMS) sensor. According to some implementations, the sensor outputs comprise outputs from one or more sensors of an accelerometer. In accordance with some implementations, the sensor outputs comprise outputs from one or more sensors of a gyroscope. In yet another implementation, the sensor outputs comprise outputs from one or more sensors of an optical pixel sensing circuit or another type of sensing circuit and/or sensing device.

BRIEF DESCRIPTION OF THE DRAWINGS

Various non-limiting embodiments are further described with reference to the accompanying drawings in which.

DETAILED DESCRIPTION

Figure 1:
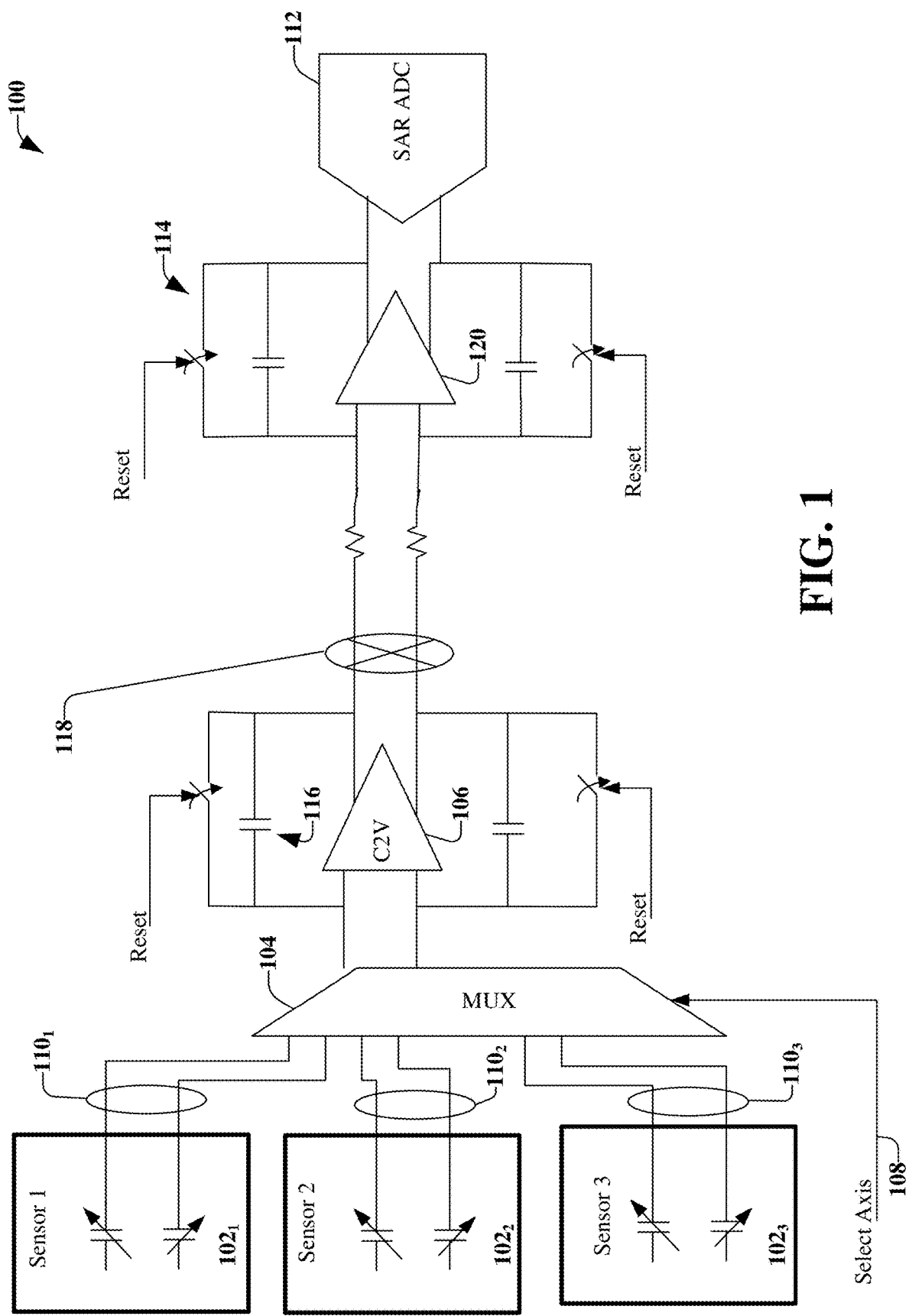
FIG. 1 illustrates an example, non-limiting, sensor circuit in accordance with one or more embodiments described herein.

One or more embodiments are now described more fully hereinafter with reference to the accompanying drawings in which example embodiments are shown. In the following description, for purposes of explanation, numerous specific details are set forth in order to provide a thorough understanding of the various embodiments.

Existing sensor systems include an amplifier that senses a change in sensor charge and converts the charge to analog voltage. The existing sensor system also includes an analog to digital convertor (ADC) that digitizes the analog voltage for further signal processing in the digital domain. A standard approach to such sensor processing is to have a separate circuit that includes an amplifier and an ADC per each sensor. For example, if a sensor (e.g., an accelerometer, a gyroscope, and so on) senses in three directions (or axes), there would be three separate circuits. This existing sensor system consumes significant circuit area, thus increasing cost, and power.

An alternative approach is to share the amplifier and an ADC between multiple sensors. However, this approach results in noise aliasing which requires a large amount of electrical current to overcome. Additionally, some sensor systems contain large harmonic content in addition to signal of interest. These harmonics require a reduction in signal gain in front of the ADC, which also increases ADC noise. For example, if there are three axes, each axis is processed one third of the time. The aliasing is where the noise per axis increases by the square root of the number of axes (in this case three) that are being processed. In the example of three axes, two-thirds of the time is wasted when attempting to process an axis (as that time is being consumed by the other axes).

The disclosed embodiments can significantly reduce the noise and harmonic penalty by pairing the amplifier with a resettable integrator and an ADC, which mitigates and/or reduces noise aliasing and eliminates unwanted harmonics. In an example, the ADC can be a Nyquist ADC. Thus, the disclosed embodiments allow for a significant improvement in noise versus current performance of the sensor system.

For example, if a sensor has three axes of rotation, the number of circuits is multiplied by three (e.g., three different circuits). Also, in a standard amplifier, the amplifier could have multiple stages to achieve a certain gain or multiplication of the signal. Generally, only the first stage contributes to noise in the system. After the first stage, the signal is amplified sufficiently that the other stages do not contribute much to noise. However, such stages still contribute to the electrical current. Thus, the electrical current is multiplied by the number of axes and such electrical current is wasted as it is not useful in terms of reducing noise.

In contrast, the disclosed embodiments provide a sensor that rotates from sensor-to-sensor (round robin approach), which is used to minimize the number of circuits and reduce current and circuit area. In an implementation, although there are three axes, there is one circuit set. Thus, the number of circuits that contribute to the electrical current is reduced as compared to existing sensors.

Another existing approach in sensors is to use of Sigma-Delta (SD) ADCs. However, the SD ADCs require averaging or decimation to produce a low noise output and the averaging requires a significant amount of time to settle to a final value, making speedy rotation from axis to axis difficult.

An alternative is to use a Nyquist ADC since it produces data quickly and does not require averaging. However, all high resolution Nyquist ADCs sample data and such sampling results in noise aliasing of input noise, which may significantly increase C2V amplifier current consumption in order to be overcome. Also, some sensors contain unwanted harmonics which further reduce allowable signal gain and cause an increase in ADC noise.

The disclosed embodiments can significantly reduce the noise and harmonic penalty by pairing the amplifier with a resettable integrator and a Nyquist ADC, for example. This reduces noise aliasing and eliminates unwanted harmonics allowing for a significant improvement in noise versus current performance of the system.

As mentioned, in existing sensors, a single C2V amplifier and a Sigma-Delta ADC is used for each sensor. For the disclosed embodiments, a Round Robin (or rotating amplifier) approach is used, which includes a single C2V and a single Nyquist ADC (typically SAR), which are used for all sensors. However, such systems consume more electrical current, due to SAR ADC sampling of noise and sensor harmonics. A placement of a simple Anti-Aliasing Filter (AAF) in front of the SAR does not completely eliminate aliasing or harmonics since the bandwidth of this filter must be sufficiently high to allow for fast settling due to rotation from one sensor (sensor axis) to the next.

In some round robin systems, three separate sample-and-hold low pass filters (FIG. 3) are used to generate AAF profile with a notch at drive frequency. The use of separate filters is needed to allow settling of filter output over multiple cycles for each axis while C2V is rotating between axis. This is needed in the system where SD or Incremental ADC is used. However, such system consumes more current and area due to use of three separate filters. Still, in other Round Robin systems no filters are used and the filtering is done within the ADC (such as in Continuous time Sigma-Delta ADCs). However, due to SD ADC settling time the ODR per axis must be very low, which has an impact on VRE (acoustic offset). Still another alternative is to use a higher clock frequency for incremental SD. In all cases, however, either design requires high current (e.g., three AAFs or high-speed incremental SD) or there is a VRE impact.

The one or more embodiments provided herein can facilitate continuous round-robin processing of sensor data while minimizing current consumption and circuit area versus noise performance. With reference initially to FIG. 1, illustrated is an example, non-limiting, sensor circuit 100 in accordance with one or more embodiments described herein. The sensor circuit 100 illustrated is for an accelerometer sensor system. However, according to some implementations, the sensor circuit can be utilized with other types of sensor systems such as, for example, a gyroscope, an optical pixel sensing device, another sensing device, and so on). Thus, the sensor circuit 100 can be included in an accelerometer circuit, a gyroscope circuit, an optical pixel sensing circuit, and so forth.

The sensor circuit 100 is a round-robin sensor system that rotates from sensor to sensor. The sensor circuit 100 includes one or more sensors. In this example, the sensor circuit 100 is a three-axes system and, thus, there are three sensors illustrated as a first sensor $102_1$, a second sensor $102_2$, and a third sensor $102_3$. Also included is a multiplexer stage 104 that operatively connects the one or more sensors (e.g., the first sensor $102_1$, the second sensor $102_2$, and the third sensor $102_3$) sequentially to a charge-to-voltage amplifier or converter (C2V 106).

The multiplexer stage 104 is configured to sequentially select, as indicated at 108, sensor outputs from the one or more sensors. For example, the multiplexer stage 104 can select a first output $110_1$ (indicated by the outputs represented within the circled area) from the first sensor $102_1$, a second output $110_2$ (indicated by the outputs represented within the circled area) from the second sensor $102_2$, a third output 1103 (indicated by the outputs represented within the circled area) from the third sensor $102_3$, and so on. The selection of sensor outputs by the multiplexer stage 104 is performed continuously, resulting in a stream of selected sensor outputs. For example, the multiplexer stage 104 can select the first output $110_1$ from the first sensor $102_1$, followed by the second output $110_2$ from the second sensor $102_2$, followed by the third output 1103 from the third sensor $102_3$, followed by the first output $110_1$ from the first sensor $102_1$, followed by the second output $110_2$ from the second sensor $102_2$, and so on.

The C2V 106 is configured to convert respective charges from the sensors to respective voltages. Thus, the C2V 106 is configured to convert a charge from the first sensor $102_1$ into a first voltage; charge from the second sensor $102_2$ into a second voltage; and charge from the third sensor $102_3$ into a third voltage, and so on. According to some implementations, a charge sensing circuit can be used instead of the C2V amplifier.

An integrator 114 operatively couples the C2V 106 to an analog-to-digital converter (ADC 112). For example, the integrator 114 is coupled, at a first side, to the C2V 106 and the integrator 114 is coupled, at a second side, to the ADC 112. The integrator 108 is a resettable integrator. The integrator 114 is configured to demodulate and integrate the one or more voltages, converted by the C2V 106, resulting in one or more integrated voltages. The ADC 112 is configured to digitize the one or more integrated voltages to one or more digital codes. In some implementations, the ADC is a SAR ADC. However, according to some implementations, a Nyquist ADC can be used instead of a SAR ADC.

There is also additional circuitry (not illustrated) that drives the sensor system. For example, for an accelerometer, the additional circuitry can include a simple square voltage waveform that is connected to one end of a MEMS capacitor. In another example, for a gyroscope circuit, the additional circuitry can be a feedback circuit that sustains oscillation. In a further example, for an optical pixel sensing circuit, the additional circuitry can be a pre-charge mechanism that charges an optical diode to a certain voltage in a periodic way. It is noted that the driving circuitry sets a processing period (drive period) for each sensor axis.

Whenever there is a charge change at, for example, the first sensor, the amplifier pushes the charge across a feedback capacitor 116 to the output and a voltage equivalent is detected at a demodulator 118 (e.g., prior to demodulation). As illustrated, the demodulator 118 is operatively connected between the C2V 106 and the integrator 114. Upon or after demodulation, an output of the demodulator 118 is input to the integrator 114. Upon or after integration, the ADC samples on the capacitors at the output of the integrator 114 and the ADC 112 begins processing the data. At substantially the same time as the ADC 112 is processing the data, the integrator 108 and C2V 106 are reset, and the multiplexer stage 104 selects another sensor of the one or more sensors.

Figure 2:
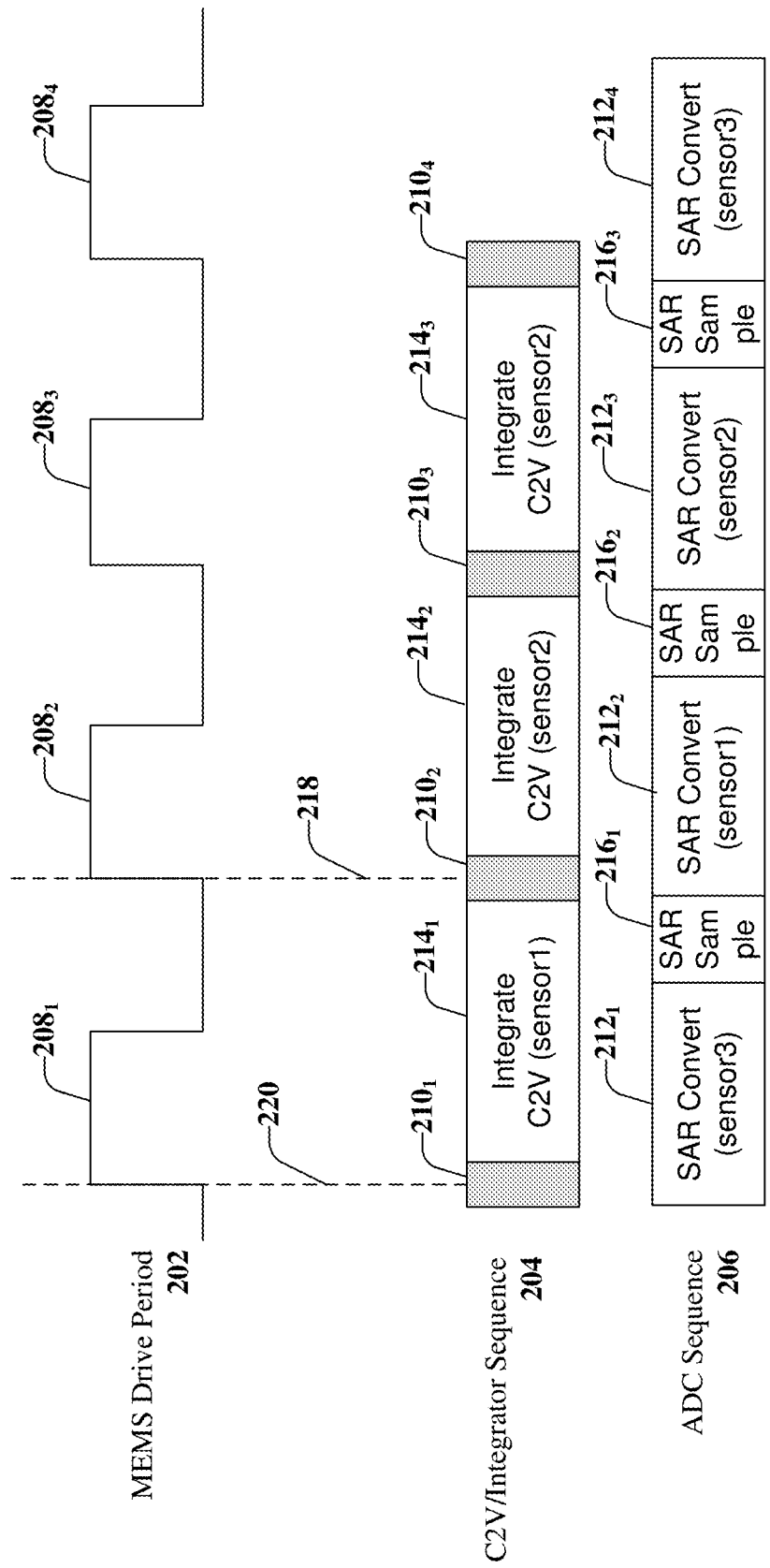
FIG. 2 illustrates an example, non-limiting, waveform and example, non-limiting sequences associated with outputs of the sensor system of FIG. 1 in accordance with one or more embodiments described herein.

With reference also to FIG. 2, illustrated are an example, non-limiting, waveform and example, non-limiting sequences associated with outputs of the sensor system of FIG. 1 in accordance with one or more embodiments described herein. Specifically, illustrated are a waveform for a drive period 202, a CV2 and/or integrator sequence 204, and an ADC sequence 206.

The sensor circuit 100 (or MEMS circuit) receives, as input, a voltage having a drive period, such as the example, non-limiting, drive period 202 of FIG. 2. In the beginning of the drive period 202 the C2V 106 and integrator 114 are reset, as indicated at $208_1$ of the drive period 202 (where the reset is the high state of the drive period 202). The reset periods $210_1$, $210_2$, $210_3$, $210_4$ are illustrated by the shaded blocks of the C2V/integrator sequence 204. Upon or after the C2V 106 and integrator 114 are reset, the C2V 106 starts converting sensor charge change to voltage (e.g., as indicated at $212_1$, $212_2$, $212_3$, $212_4$ of the ADC sequence 206). During the same period, the C2V 106 output is demodulated and the integrator 114 integrates the voltage, as indicated at $214_1$, $214_2$, $214_3$, $214_4$ of the C2V/Integrator sequence 204. Upon or after integration, the ADC samples the capacitors at the output of the integrator 114 and the ADC 112 begins processing the data, as indicated at $216_1$, $216_2$, and $216_3$.

At the end of the first drive period, indicated by line 218 of the ADC sequence 206, the ADC 112 samples the integrated voltage and starts digitizing the integrated voltage. Meanwhile, near the end of the previous drive period (indicated by line 220) and at the beginning of the new drive period the C2V 106 and integrator 108 are reset and the process begins again.

In further detail, the shaded portions $210_1$, $210_2$, $210_3$, and $210_4$ represent rest periods that straddle drive periods $214_1$, $214_2$, and $214_3$. In an example, the integrator 108 and C2V 106 are reset, at $210_1$, and the first sensor is integrated, at $214_1$. Prior to the end of the integration at $214_1$, a sample period $216_1$ is performed on the SAR, which allows time for sampling and settling. At the end of the period, the capacitors are disconnected, and the ADS starts the conversion internally, and the process starts again.

Thus, the ADC finishes sampling the output of the integrator right before the C2V and integrator are reset. The ADC proceeds to digitize the sampled value for the previous axis while the C2V and integrator are reset and then integrates the next axis analog input.

Figure 3:
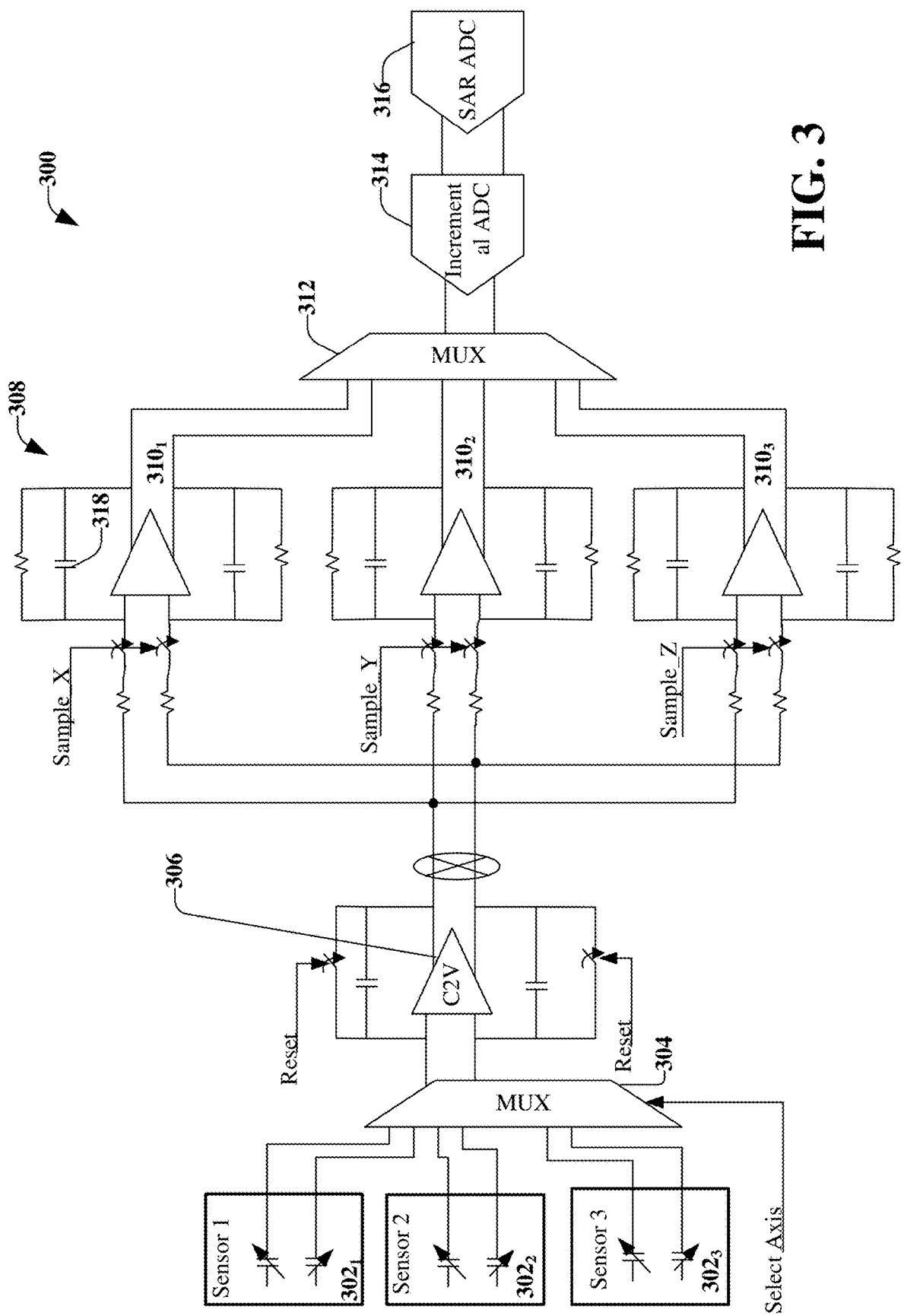
FIG. 3 illustrates an example, non-limiting, sensor system that includes three separate amplifiers.

FIG. 3 illustrates an example, non-limiting, sensor circuit 300. The sensor circuit 300 includes multiple sensors, illustrated as a first sensor $302_1$, a second sensor $302_2$, and a third sensor $302_3$. Also included in the sensor circuit 300 is a multiplexer 304 configured to select an axis (e.g., respective sensor outputs of the multiple sensors) and a C2V 306 with a reset.

In this sensor circuit 300, a low pass filter configuration 308 includes three separate amplifiers, illustrated as a first amplifier $310_1$, a second amplifier $310_2$, and a third amplifier $310_3$. For example, the first amplifier $310_1$ is associated with sample x (e.g., the first sensor $302_1$); the second amplifier $310_2$ is associated with sample y (e.g., the second sensor $302_2$); and the third amplifier $310_3$ is associated with sample z (e.g., the third sensor $302_3$). Outputs of the respective amplifiers are input to another multiplexer 312, then to an incremental ADC 314 and a SAR ADC 316.

The first resistor-capacitor (RC) circuit of the first amplifier $310_1$ is a filter. The filter corner is low enough to eliminate noise aliasing, however, the filter corner is too low to allow for a complete settling of the signal in one cycle.

In this case, the first axis (e.g., sample x) is disconnected, and the circuit moves onto the second axis (e.g., sample y). When the circuit returns to the first axis (e.g., sample x), the circuit continues sampling an original axis adding the new signal to the one previously stored in the feedback capacitor 318. This sequence repeats several cycles until the amplifier output settles to a final value. The final value is digitized by the ADC (e.g., the incremental ADC 314 and/or the SAR ADC 316).

Figure 4:
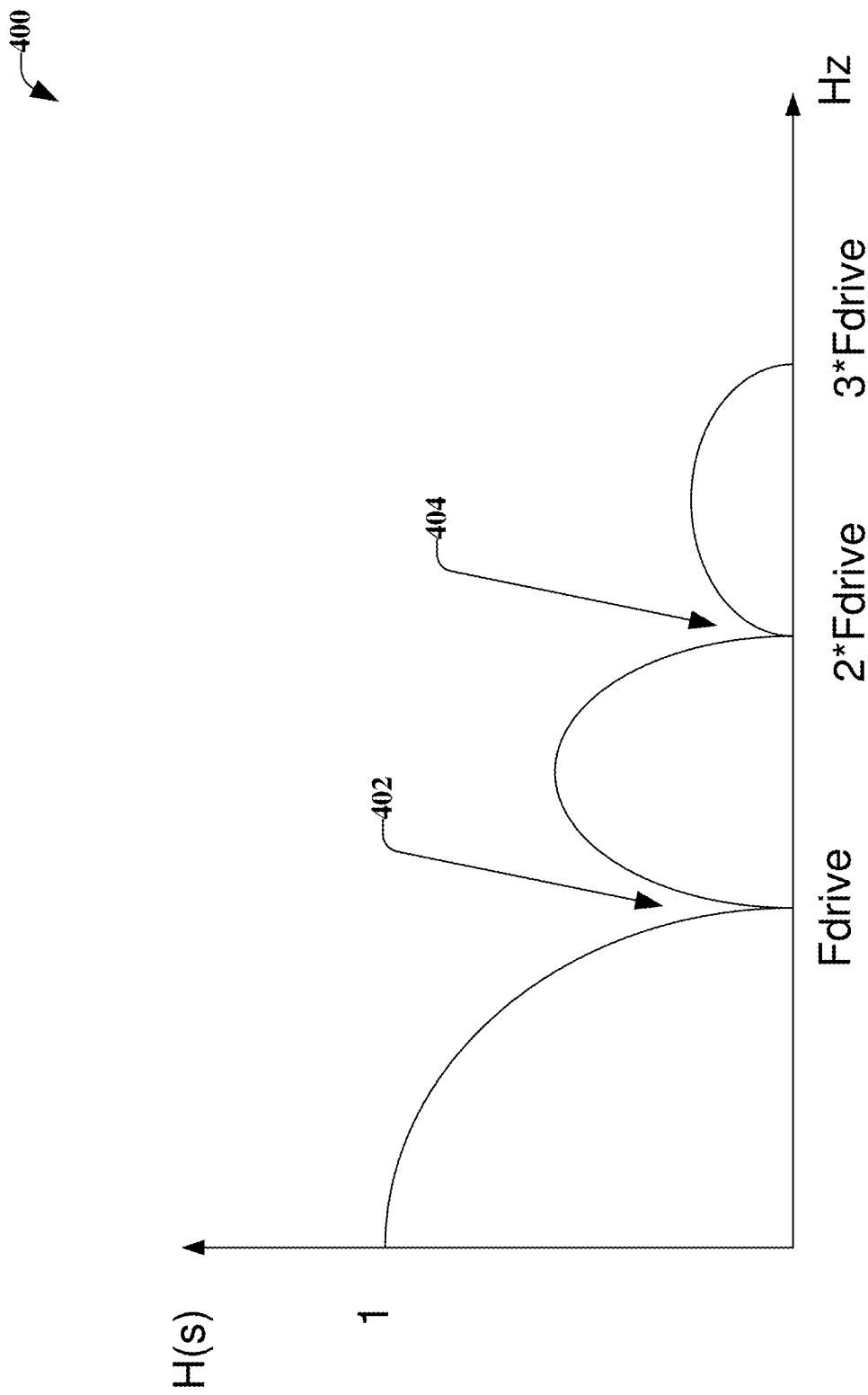
FIG. 4 illustrates an example, non-limiting, graph of frequency response at the integrator output of the sensor system of FIG. 1 in accordance with one or more embodiments described herein.

FIG. 4 illustrates an example, non-limiting, graph 400 of frequency response at the integrator output of the sensor circuit 100 of FIG. 1 in accordance with one or more embodiments described herein.

Illustrated on the horizontal axis is hertz (Hz) and on the vertical axis is frequency response (H(s)). As illustrated, the integrate-and-reset function creates notches, indicated at 402 and 404 at the frequency of integration (same as drive frequency), since integration of a sinusoid over a period of that sinusoid averages to zero. The frequency of integration is the same as drive frequency (e.g., Fdrive, 2*Fdrive, 3*Fdrive).

It is noted that a frequency response of the sensor circuit 300 of FIG. 3 has notches at the Fdrive. However, the area of the sensor circuit 300 is large and the three amplifiers consume more current than the sensor circuit 100 of FIG. 1.

As discussed herein, provided is a round robin sensor device for processing sensor data and related methods. The use of a resettable integrator, as discussed herein, reduces noise aliasing and eliminates unwanted harmonics. Further, the use of the resettable integrator provides increased signal gain due to elimination of unwanted harmonics in front of the ADC to reduce ADC input referred noise.

Methods that can be implemented in accordance with the disclosed subject matter, will be better appreciated with reference to various flow charts. While, for purposes of simplicity of explanation, the methods are shown and described as a series of blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g., device, system, process, component, and so forth). Additionally, it should be further appreciated that the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 5:
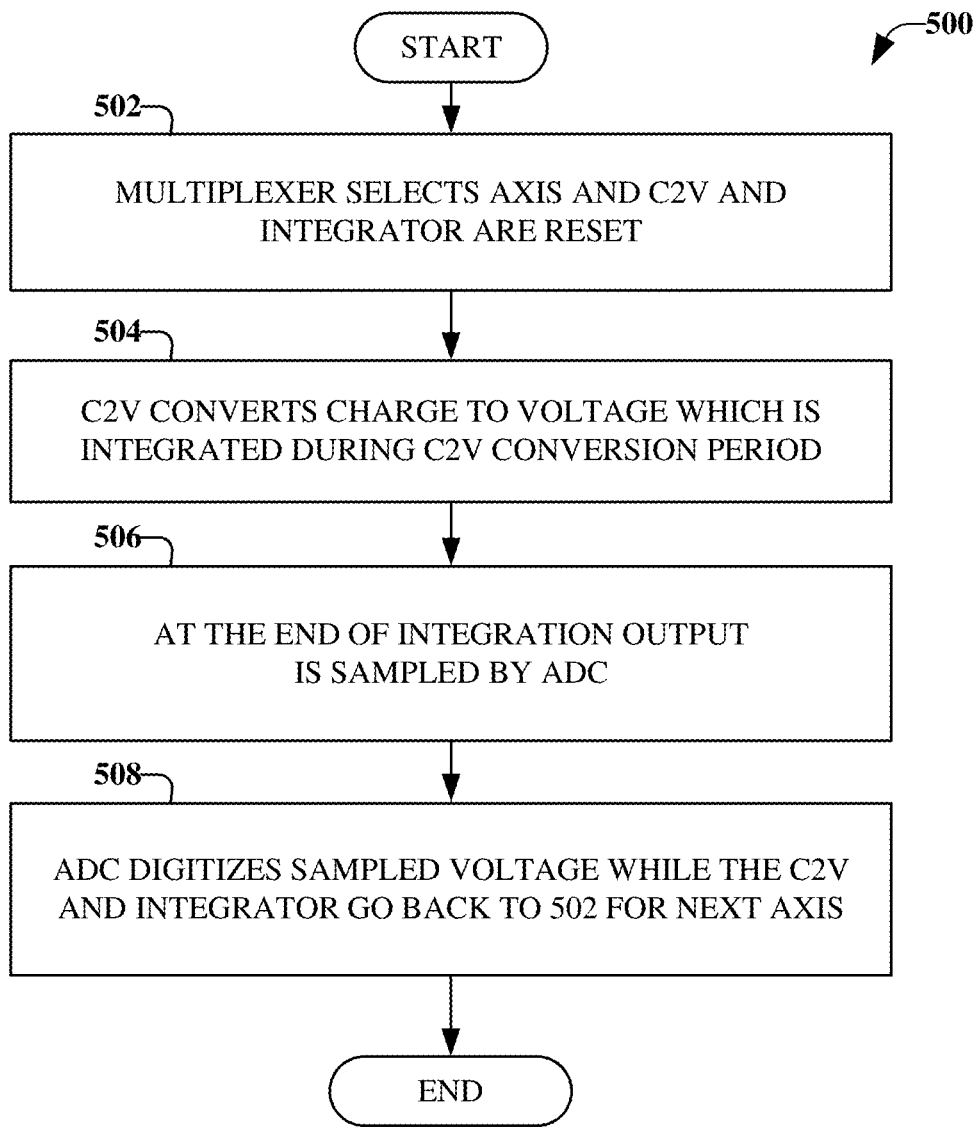
FIG. 5 illustrates a flow diagram of an example, non-limiting, computer-implemented method for round robin sensor detection in accordance with one or more embodiments described herein.

FIG. 5 illustrates a flow diagram of an example, non-limiting, computer-implemented method 500 for round robin sensor detection in accordance with one or more embodiments described herein. Repetitive description of like elements employed in other embodiments described herein is omitted for sake of brevity. The computer-implemented method 500 can be implemented by a circuit (e.g., the sensor circuit 100 of FIG. 1), by a MEMS sensor, an accelerometer, a gyroscope, an optical pixel sensing circuit, and so on.

At 502 of the computer-implemented method 500 a multiplexer selects an axis, and C2V and Integrator are reset. The C2V converts charge to voltage, at 502, which is integrated during C2V conversion period. Further, at 504, at the end of integration, the output is sampled by ADC. At 506, the ADC digitizes the sampled voltage while the C2V and Integrator return to 502 for the next axis.

As discussed herein, provided is a round robin sensor device for processing sensor data, related circuits, and related methods. The use of a resettable integrator, as discussed herein, reduces noise aliasing and eliminates unwanted harmonics. Further, the use of the resettable integrator provides increased signal gain due to elimination of unwanted harmonics in front of the ADC to reduce ADC input referred noise.

According to some implementations, the area used with the sensor circuit 200 of FIG. 2 is smaller than the area of a comparably performing circuit (e.g., the sensor circuit 300 of FIG. 3). Current consumption of the sensor circuit 100 of FIG. 1 is significantly less than prior systems. Thus, as discussed herein, the disclosed embodiment minimizes current consumption and circuit area versus noise performance.

Thus, provided herein is a sensor system for processing sensor data that includes a charge-to-voltage converter, a resettable integrator, and a Nyquist ADC used for converting respective charge of sensors of a group of multiple sensors to respective digital code. For example, the sensor system can first convert charge to voltage, demodulate and integrate the voltage, and digitize the voltage by means of ADC. This can be performed at a same time, or substantially the same time, as switching to the next sensor and converting and integrating the next sensors charge to voltage in a repetitive (e.g., round-robin) fashion.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics can be combined in any suitable manner in one or more embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, the various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A sensor device, comprising:
a multiplexer stage configured to sequentially select sensor outputs from one or more sensors continuously, resulting in a stream of selected sensor outputs;
a charge-to-voltage converter operatively coupled to the multiplexer stage and configured to convert a charge from a first sensor of the one or more sensors to a voltage;
a single resettable integrator operatively coupled to the charge-to-voltage converter and configured to demodulate and integrate the voltage, resulting in an integrated voltage; and
analog-to-digital converter operatively coupled to the single resettable integrator and configured to digitize the integrated voltage to a digital code.

2. The sensor device of claim 1, wherein the multiplexer stage selects a second sensor of the one or more sensors at a same time as the analog-to-digital converter digitizes the integrated voltage.

3. The sensor device of claim 1, wherein the multiplexer stage comprises a multiplexer that sequentially selects the sensor outputs repetitively.

4. The sensor device of claim 3, wherein the multiplexer sequentially selects the sensor outputs according to a round-robin selection sequence.

5. The sensor device of claim 1, wherein sensors of the one or more sensors represent one or more axes, and wherein the multiplexer stage is configured to select an axis of the one or more axes in a sequential and continuous sequence.

6. The sensor device of claim 1, wherein the analog-to-digital converter is a Nyquist analog to digital converter.

7. The sensor device of claim 1, wherein the one or more sensors comprise a micro electro-mechanical system (MEMS) sensor.

8. The sensor device of claim 1, wherein the sensor device is an accelerometer.

9. The sensor device of claim 1, wherein the sensor device is a gyroscope.

10. A method for processing sensor data, comprising:
selecting, by a multiplexer stage, sensor outputs of a sensor in a repetitive sequence, resulting in a stream of selected sensor outputs;
converting, by a charge-to-voltage converter, a charge from the sensor outputs into a voltage;
demodulating and integrating, by a single resettable integrator, the voltage, resulting in an integrated voltage;
converting, by a analog to digital converter, the integrated voltage into a stream of digitized outputs; and
switching to a next sensor, wherein the converting the voltage and the switching are performed at a same time.

11. The method of claim 10, further comprising:
determining that sampling by the analog to digital converter is completed; and
resetting the charge-to-voltage converter and the single resettable integrator based on the determining.

12. The method of claim 10, wherein a sensor output of the sensor outputs represents a current axis, and wherein the method further comprises:
digitizing a value previously sampled for a previous axis, wherein the previous axis is an axis previous to the current axis;
resetting the charge-to-voltage converter and the single resettable integrator at substantially the same time as the digitizing; and
integrating a next axis analog input after the resetting, wherein the next axis is an axis subsequent to the current axis.

13. The method of claim 10, wherein the repetitive sequence is a round-robin selection sequence.

14. The method of claim 10, wherein the switching to the next sensor comprises sequentially selecting the sensor outputs repetitively.

15. The method of claim 10, wherein the sensor outputs comprise outputs from a micro electro-mechanical system (MEMS) sensor.

16. The method of claim 10, wherein the sensor outputs comprise outputs from one or more sensors of an accelerometer.

17. The method of claim 10, wherein the sensor outputs comprise outputs from one or more sensors of a gyroscope.

* * * * *